United States Patent
Mosshammer et al.

(10) Patent No.: US 9,057,130 B2
(45) Date of Patent: Jun. 16, 2015

(54) TRANSPORT ROLLER FOR THE VACUUM TREATMENT OF SUBSTRATES

(75) Inventors: Steffen Mosshammer, Rabenau (DE);
Reinhardt Bauer, Dresden (DE);
Thomas Meyer, Dresden (DE);
Matthias Smolke, Leipzig (DE);
Michael Hofmann, Dresden (DE);
Torsten Dsaak, Dresden (DE)

(73) Assignee: VON ARDENNE GmbH, Dresden (DE)

( * ) Notice: Subject to any disclaimer, the term of this patent is extended or adjusted under 35 U.S.C. 154(b) by 184 days.

(21) Appl. No.: 13/473,663

(22) Filed: May 17, 2012

(65) Prior Publication Data
US 2012/0292289 A1 Nov. 22, 2012

(30) Foreign Application Priority Data
May 20, 2011 (DE) .......................... 10 2011 102 684
Sep. 20, 2011 (DE) .......................... 10 2011 083 061

(51) Int. Cl.
| | |
|---|---|
| C23C 16/50 | (2006.01) |
| C23C 16/00 | (2006.01) |
| C23F 1/00 | (2006.01) |
| H01L 21/306 | (2006.01) |
| C23C 14/56 | (2006.01) |

(52) U.S. Cl.
CPC .................................. C23C 14/562 (2013.01)

(58) Field of Classification Search
CPC ................................ B65G 49/05; B65G 49/07
USPC .......... 118/718, 719, 729; 156/345.2, 345.31, 156/345.54; 198/778, 780–791; 193/37; 414/217
See application file for complete search history.

(56) References Cited

U.S. PATENT DOCUMENTS

| | | | | |
|---|---|---|---|---|
| 3,853,526 A | * | 12/1974 | Hochart | .......................... 65/253 |
| 4,421,482 A | | 12/1983 | McMaster | |
| 2009/0148669 A1 | * | 6/2009 | Basol | ............................ 428/189 |

FOREIGN PATENT DOCUMENTS

| | | |
|---|---|---|
| DE | 69616933 T2 | 6/2002 |
| DE | 102008022689 A1 | 12/2009 |
| JP | 6001510 A | 1/1994 |
| JP | H061510 A | 1/1994 |
| JP | 8143136 A | 6/1996 |
| JP | H08143136 A | 6/1996 |

OTHER PUBLICATIONS

National Examination Report issued for corresponding German application No. 10 2012 208 218.2 dated May 17, 2013.

* cited by examiner

*Primary Examiner* — Maureen Gramaglia
*Assistant Examiner* — Tiffany Nuckols
(74) *Attorney, Agent, or Firm* — Heslin Rothenberg Farley & Mesiti P.C.

(57) ABSTRACT

A transport cylinder for the vacuum treatment of substrates includes a roll body and at least one spacer element arranged on the roll body and enveloping the roll body. The spacer element is made of a knitted tube containing metallic or/and metallic threads.

7 Claims, 1 Drawing Sheet

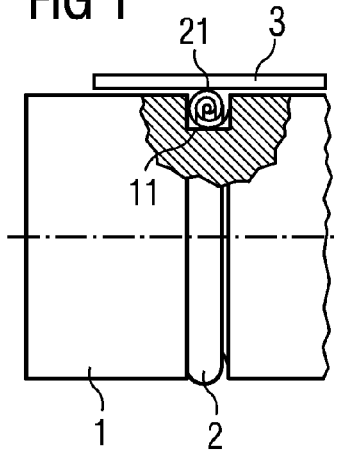
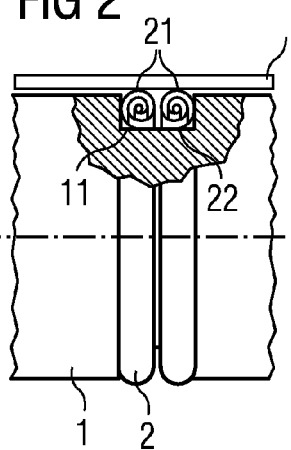
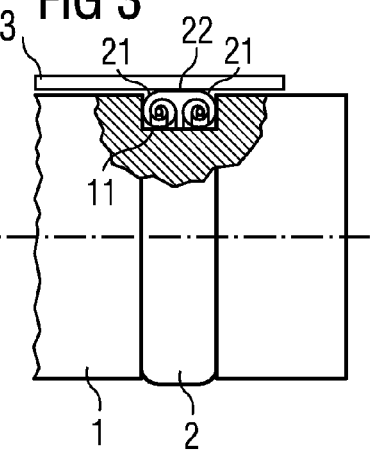
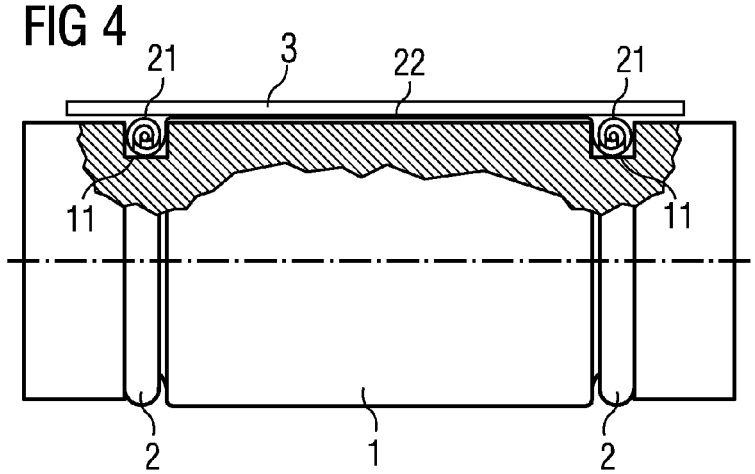
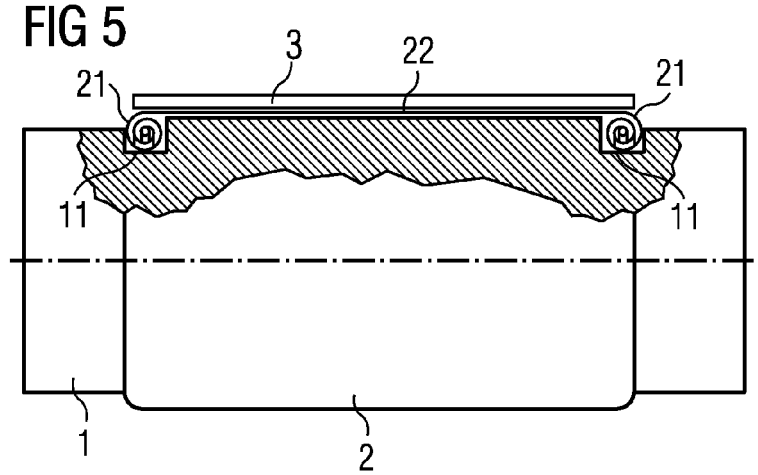

TRANSPORT ROLLER FOR THE VACUUM TREATMENT OF SUBSTRATES

CROSS REFERENCE TO RELATED APPLICATIONS

This application claims priority of German Application No. 10 2011 102 684.7 filed on May 20, 2011 and German Application No. 10 2011 083 061.8 filed on Sep. 20, 2011, the entire disclosures of these applications being hereby incorporated herein by reference.

BACKGROUND ART

The invention relates to a transport roller for the vacuum treatment of substrates, in particular for the conduct of coating and/or etching processes involving planar substrates such as architectural glass, solar cells and so forth. These processes are generally conducted under sub-atmospheric pressure, if necessary in the presence of a process gas, for instance an inert gas or a reactive gas, and in some cases under high temperatures, for example 600 or 800° C.

The transport rollers installed in a vacuum coating system are available in diverse forms and different materials. For example, interconnected transport rollers supported on two sides and powered on one or both sides are known. Furthermore, unconnected transport rollers arranged in pairs exist, which only support the substrate on both sides and transport it.

To transport, in particular, planar substrates through process systems in which these processes are taking place, transport systems are known which comprise an arrangement of transport rollers arranged in tandem transversely to the transport direction of the substrates, and rotatable supported on their ends, wherein at least some of the transport rollers can be powered. The substrates are placed onto the transport plane formed by the transport rollers and moved through the process system in the transport direction by rotating the transport rollers. In so doing, the substrates are moved past treatment systems, for example, systems for removing a surface layer from the substrates or systems for depositing a coating material on the surface of the substrates, so that the desired treatment processes are carried out.

Depending on the intended use, the transport rollers can be made of metallic materials, for example stainless steel or aluminum, or of non-metallic materials, for example industrial ceramics such as aluminum oxide, silicon oxide and so on. For transport rollers made of ceramic materials, it is further known that the ends on which the transport rollers are rotatably supported are provided with so-called end caps made of metallic materials.

The surface "hardness" of all listed roller materials is similar to that of the substrates to be transported. In the process, the buffing of the substrate edges generates loud noises and additional stress on the substrate, especially if the substrates are not completely flat or if the distances between the rollers are large due to the design (e.g. between two chambers or in the region of the chamber valve). This is particularly problematic in connection with accelerating runs and with thin or brittle substrates and can lead to substrate rupture. This situation results in prolonged down times, in particular with hot vacuum systems and, hence, to high losses in production.

The purpose of the heaters installed in a vacuum coating system is to set required temperature profiles on the substrate. Stable substrate temperatures are desirable in order to deposit layers with optimal properties. Especially in horizontal coating systems, the substrate is transported through the system on transport rollers. The thermal energy generated by the installed heaters is in part also transmitted to the transport rollers. If the substrate transport is impaired, above average heat input by means of heaters or coating sources into the transport rollers is possible for approximately 10 minutes. As a result, high local temperature gradients may occur in the transport roller, causing deformation (metal) or breakage (ceramic) with roller temperatures of 250° C. and higher.

The heat in particular introduced into the outer roller areas is removed through thermal conduction in the rollers and can result in the damage of temperature-sensitive assemblies of the transport system, unless they have a sufficiently temperature-sensitive design. In order to limit the heat input into the transport rollers, the lower heaters can be arranged between the transport rollers. The substrates shield the transport rollers from the upper heaters, thus preventing the heat input from this direction. However, this procedure is ineffective in the event that the system is operated with no load (e.g. conditioning of an empty chamber). In that case, the heat is mainly introduced by the upper heaters which can radiate onto the transport rollers unhindered if the substrate is missing.

One aspect of the invention is to reduce the heat input into the transport rollers and the thermal exposure of heat-sensitive assemblies.

In order to protect the substrates from being damaged because of scratching during the transport, the transport rollers can be provided with a plurality of cuffs or O-rings made of permanently elastic materials such as rubber, Viton or similar material, distributed across the entire length, in order to reduce the contact area between the transport cylinder and the substrate. Nevertheless, it is extremely difficult to achieve a completely scratch-free transport of the substrates. A further disadvantage is that the material of the O-ring does not allow the use at higher temperatures, the substrate is only supported punctiformally and the service life is very limited.

Due to the limited thermal durability of rubber, Viton and similar materials as well as the high costs of other elastomers, the object of the invention is to find a suitable replacement material or replacement design to substitute for O-rings made of elastomeric materials. Therefore, a replacement of traditional O-rings will be proposed, with comparable elastic properties to known elastomers. Furthermore, the friction coefficient with respect to glass should be analogous to that for the combination of a traditional elastomer and glass.

To solve the problem that particles of the coating material are deposited not only on the substrate during coating processes, but also on the transport rollers, with the result that the transport rollers need to be exchanged after a certain period of operation, it was proposed in DE 10 2008 022 689 A1 to provide an enveloping element enveloping the surface area of the roll body of a transport roller for the vacuum treatment of substrates, wherein the enveloping element is mounted on the surface area and can be made for example of a fabric.

Fabric is the generic term for manually or mechanically manufactured products of the weaver's trade or other textile areal structures having at least two thread systems crossed at a right angle or almost at a right angle. The threads running in longitudinal direction are referred to as warp or beam threads. The diagonal threads are called picks or weft threads. The areas are connected with the thread crossing connection type. Thread crossing does not mean that the threads are placed on top of each other crossed, but that the threads are passing above and underneath the diagonal threads at a certain rhythm (known as weave). In order for a fabric to have adequate non-slip properties, the warp and weft threads are usually weaved relatively dense. With a few exceptions, the fabrics therefore have a tight fabric appearance.

Known metal fabrics are manufactured with mesh sizes ranging between 0.06 and 4 mm, fabric widths of up to 6000 mm as yard ware in rolls, in the weaving modes smooth or linen texture, braiding, armored braiding, body braiding, wherein wire diameters between 0.16 and 2 mm are used.

If the proposed transport cylinder is used in a coating process, the particles of the coating material are no longer deposited on the roll body but rather on the enveloping element covering the roll body. In contrast, if the transport cylinder is used for stripping processes, the stripping will not affect the roll body, but the enveloping element. If necessary, said type of enveloping element can easily and quickly be detached from the roll body and exchanged for a new enveloping element. There is no need to clean the cylinder element and as a result, the risk of damage during the cleaning can be prevented as well.

However, it has been demonstrated that the risk of arcing cannot be completely excluded with the use of said types of fabrics for the mentioned purpose, for example, in plasma-assisted processes. Furthermore, these types of fabrics have a relatively high thermal conductivity which can lead to an undesirable uneven temperature distribution on the substrate. Finally, fabrics are not very flexible due to their relatively smooth and tight surface, on the one hand, and slippage between the substrate and the surface of the fabric cannot be completely excluded, on the other hand.

For these reasons, a further aspect of the invention is to find a suitable replacement material or a replacement design to substitute for enveloping elements made of fabric, having similar elastic properties as known elastomers, allowing a slip-free transport of the substrates while not resulting in undesirable arcing.

BRIEF SUMMARY OF INVENTION

A transport roller for the vacuum treatment of substrates is proposed, which comprises a roll body and at least one spacer element arranged on the roll body and enveloping the roll body, wherein the spacer element is made of a knitted tube containing metallic or/and ceramic threads.

Accordingly, a fundamental idea of the invention is to use a knitted fabric to solve the described objects, said knitted fabric containing ceramic fibers or/and metallic fibers and similar high-temperature resistant fibers and mixtures thereof. Based on the fact that said knitted fabrics consist of extremely thin fibers, the initial flexibility is high. Knitted metal fiber fabrics for instance are manufactured with a significantly thinner thread than metal wire fabric, for example with a diameter in the range of only 10 to 100 µm.

In turn, the enmeshment of the fibers creates a high degree of elasticity. The use of stainless steel or ceramic materials as a base material ensures a high temperature resistance and vacuum capability. Because the thread structure runs at least in part transversally, i.e. diagonally to the area of the knitted fabric, these kinds of knitted fabrics have a high thermal reflection. Thanks to the development of potential within them, these knitted fabrics are free of arcing, low-scratch for the substrate and both elastic and hence held on the transport rollers because of their specific structure and have a large specific absorption volume for scattering steams, wherein the greatly enlarged surface improves the adhesive properties and the scaling of the collected scattering steam is prevented as a result.

Because of the elasticity of the knitted tube, it is possible to use a tube with a considerably smaller diameter than the transport roller itself and mount it on the entire transport roller. In so doing, the tube retains its elasticity as a knitted fabric and achieves excellent damping and soft buffing of the substrate. The frictional forces induced by the extension of the tube between the roll body and the knitted fabric ensure a slip-free transmission of the moving forces onto the knitted fabric.

The knitted tube pulled over the transport roller acts as an element reflecting thermal radiation having a low thermal contact with the transport roller itself, thus contributing to the reduction of the heat input into the transport rollers and the thermal exposure of heat-sensitive assemblies. Because of this effect, various assemblies of the transport system only need to meet reduced temperature requirements and can therefore be manufactured more efficiently and at a lower cost.

Thanks to its elasticity, the knitted tube has a good roll-up capacity at the cut ends. This results in a variety of structural possibilities for a simple, no-wear design of the ends of the knitted fabric or for a cost-efficient realization of the fixation of the ends.

These kinds of knitted fabrics are for example, available as seamless tubular knitted fabric.

In a first variant, the tube can be divided, for example, into sections of approximately 10 cm each. Next, each of these sections is rolled up from one end. The fabric is rolled up within the meaning of turning it inside out, centered relative to the longitudinal axis of the knitted tube, so that a ring is created in the end. The rings created in this fashion can be used as substitute for O-rings made of elastomers.

In a second variant, the same material is used in a similar fashion, but the fabric is rolled up symmetrically from both ends of the tubular pieces. Double rings which can again be used as substitutes for O-rings made of elastomers are created in this fashion. The advantage of this variant consists in the symmetry and the associated prevention of problems arising in connection with the open end of the first variant.

In a third variant, said tubes can also be used virtually unprocessed by pulling them directly over the transport cylinders across the entire length. As a matter of principle, this can also be achieved with a sandwich design.

Therefore, we first propose a transport roller for the vacuum treatment of substrates, comprising a roll body and at least one spacer element arranged on the roll body and enveloping the roll body, wherein the spacer element is made of a knitted tube containing ceramic or/and metallic threads.

The spacer element is ring-shaped. As a result, it can be used in a similar fashion to the known elastomer rings which have been used often in the past, for example, arranged completely or partly inside a groove of the roll body, but it features a considerably greater resistance against high temperatures and aggressive media.

For instance, the spacer element can be arranged completely or partly directly on the surface area of a cylindrical roll body or/and completely or partly inside a groove of the roll body surrounding the entire circumference, wherein the latter variant prevents the spacer element from sliding away. The possible variants of this kind of embodiment are explained in detail below.

In one embodiment, it can be provided that the spacer element is ring-shaped. The terms "ring" and "ring-shaped" as used herein are the expressions for a shape essentially enveloping the cylindrical roll body, while only covering a very small part of its length. This means that the width of a ring or ring-shaped spacer element has roughly the same size as the radial extent of its cross-section.

Furthermore, it can be provided that the spacer element comprises a rolled up section of a knitted tube whose exterior diameter is larger than the exterior diameter of the roll body, so that the substrates transported on the transport cylinder do not have any contact with the roll body whatsoever.

The used section of the knitted tube can either be rolled up from one end or from both ends, so that two rolled up end sections are connected with each other by a middle section.

This middle section of the section of a knitted tube rolled up from both ends can—especially with a ring-shaped spacer element—be arranged for example at the base of the groove, so that the substrates transported on the transport cylinder are only in contact with the rolled up end sections.

Alternatively, the middle section of the rolled up section of the knitted tube can form the exterior diameter of the spacer element, i.e. the middle section is in direct contact with the transported substrates.

In a further embodiment in which the knitted tube is rolled up from both sides, every rolled up section of the knitted tube is arranged in one groove of the roll body each and the unrolled middle section of the knitted tube between the two rolled up sections is resting on the exterior of the roll body.

BRIEF DESCRIPTION OF DRAWING FIGURES

The invention is explained in detail below based on five different exemplary embodiments and associated drawings, FIGS. 1 to 5.

The representations of FIGS. 1 to 3 show different exemplary embodiments of ring-shaped spacer elements, each completely arranged in a groove 11 of the roll body 1, wherein the groove has a base spaced inwardly of an exterior surface of the roll body, the exterior diameter of the spacer elements is greater than the diameter of the roll body, and the spacer elements contact substrates 3.

The representation of FIGS. 4 and 5 illustrate different exemplary embodiments of spacer elements which are not ring-shaped, but which cover a larger area of the surface of the roll body 1.

DETAILED DESCRIPTION

The exemplary embodiment according to FIG. 1 relates to a spacer element 2, in which one section of the knitted tube was rolled up from one side and hence forms a rolled up section 21, and the spacer element 2 obtained in this fashion is placed into a groove 11 of the roll body 1 in such a way that the exterior diameter of the spacer element 2 is greater than the exterior diameter of the roll body 1 and the rolled up section has a spiral cross section in a plane extending along a central longitudinal axis of the roll body The exemplary embodiment according to FIG. 2 relates to a spacer element 2, in which one section of a knitted tube was rolled up from both sides and hence forms two rolled up sections 21 which are connected with each other by the unrolled middle section 22, and the spacer element 2 obtained in this fashion is inserted into a groove 11 of the roll body 1 in such a way that the exterior diameter of the spacer element 2 is greater than the exterior diameter of the roll body 1, wherein the middle section 22 is positioned at the base of the groove 11.

The exemplary embodiment according to FIG. 3 relates to a spacer element 2 in which the section of a knitted tube was again rolled up from both sides and hence forms two rolled up sections 21 which are connected with each other by a unrolled middle section 22. However, in this exemplary embodiment, the spacer element 2 obtained in this fashion is placed into a groove 11 of the roll body 1 in such a way that the exterior diameter of the spacer element 2 is greater than the exterior diameter of the roll body 1, wherein the middle section 22 forms the exterior diameter of the spacer element 2.

The representations of FIGS. 4 and 5 illustrate different exemplary embodiments of spacer elements which are not ring-shaped overall, but which cover a larger area of the surface of the roll body 1.

In these exemplary embodiments, the spacer elements are created in that a section of the knitted tube was rolled up from both sides so that rolled up sections 21 are formed on both ends of the knitted tube which are connected with each other by a longer, unrolled middle section 22. The two rolled up sections 21 each are completely arranged in a groove 11 of the roll body 1, wherein the two grooves 11 have a distance from each other in the axial direction of the roll body 1. The middle unrolled sections 22 of the spacer element 2 are resting on the exterior of the roll body 1 and fit snugly on its surface between the two grooves 11 thanks to their elasticity.

The invention claimed is:

1. Transport roller for transporting planar substrates through a vacuum treatment system, comprising a roll body extending along a central longitudinal axis and having a cylindrical exterior surface, the roll body including a groove, the groove having a base spaced inwardly of the cylindrical exterior surface of the roll body and the groove surrounding an entire circumference of the roll body, and at least one spacer element arranged on the roll body and enveloping the roll body, wherein the at least one spacer element comprises a knitted tube containing metallic or/and ceramic threads elastically held on the roll body, wherein the at least one spacer element comprises at least one rolled up section of the knitted tube, the at least one rolled up section being arranged in the groove and having an exterior diameter greater than an exterior diameter of the cylindrical exterior surface of the roll body, and the at least one rolled up section in the groove having a spiral cross-section in a plane extending along said longitudinal axis.

2. Transport roller according to claim 1, wherein the spacer element is ring-shaped.

3. Transport roller according to claim 1, wherein the knitted tube has the rolled up section at both ends of the tube.

4. Transport roller according to claim 3, wherein the knitted tube includes a middle unrolled section arranged at the base of said groove.

5. Transport roller according to claim 3, wherein the knitted tube includes a middle unrolled section forming an exterior diameter of the spacer element.

6. Transport roller according to claim 3, wherein every rolled up section of the knitted tube is arranged in a respective groove of the roll body having a base spaced inwardly of the cylindrical exterior surface of the roll body, and an unrolled section of the knitted tube between two rolled up sections of the knitted tube rests on the cylindrical exterior surface of the roll body.

7. A method of protecting a transport roller against unwanted coating and/or overheating and/or protecting substrates from being damaged during vacuum treatment of substrates, comprising:
deploying a knitted tube containing metallic or/and ceramic threads as a spacer element of the transport roller in accordance with claim 1, and vacuum treating the substrates.

* * * * *